(12) United States Patent
Miller et al.

(10) Patent No.: US 6,762,366 B1
(45) Date of Patent: Jul. 13, 2004

(54) BALL ASSIGNMENT FOR BALL GRID ARRAY PACKAGE

(75) Inventors: Leah M. Miller, Fremont, CA (US); Farshad Ghahghahi, Los Gatos, CA (US); Edwin M. Fulcher, Palo Alto, CA (US)

(73) Assignee: LSI Logic Corporation, Milpitas, CA (US)

( * ) Notice: Subject to any disclaimer, the term of this patent is extended or adjusted under 35 U.S.C. 154(b) by 273 days.

(21) Appl. No.: 09/844,530

(22) Filed: Apr. 27, 2001

(51) Int. Cl.[7] ................................................. H05K 1/00
(52) U.S. Cl. ........................ 174/250; 174/255; 174/262; 361/792; 361/803
(58) Field of Search ................................. 174/250, 255, 174/262; 361/792, 795, 803; 439/65

(56) References Cited

U.S. PATENT DOCUMENTS

| | | | | |
|---|---|---|---|---|
| 3,605,063 A | * | 9/1971 | Stewart ........................ 439/189 |
| 6,194,668 B1 | * | 2/2001 | Horiuchi et al. ............. 174/261 |
| 6,198,635 B1 | * | 3/2001 | Shenoy et al. ............... 361/760 |
| 6,271,478 B1 | * | 8/2001 | Horiuchi et al. ............. 174/255 |
| 6,388,890 B1 | * | 5/2002 | Kwong et al. ............... 361/780 |
| 6,407,344 B1 | * | 6/2002 | Horiuchi et al. ............. 174/261 |

* cited by examiner

Primary Examiner—Kamand Cuneo
Assistant Examiner—J B Patel
(74) Attorney, Agent, or Firm—Luedeka, Neely & Graham, PC

(57) ABSTRACT

A printed circuit board having contacts in a contact array of rows and columns. Groups of n columns of the contacts are electrically connected to n−1 columns of vias disposed interstitially in a via array between the n columns of the contacts. A major vertical routing channel is formed between adjacent groups of n columns of the contacts and the n−1 columns of vias. First electrical traces are electrically connected to a first number of the vias. The first electrical traces are routed to an outside edge of the via array through the major vertical routing channel.

18 Claims, 10 Drawing Sheets

BALL ASSIGNMENT FOR BALL GRID ARRAY PACKAGE

FIELD

This invention relates to the field of microelectronic circuitry fabrication. More particularly the invention relates to a system for assigning ball placements for a ball grid array package and routing the contacts with an associated printed circuit board.

BACKGROUND

As microelectronic devices get increasingly smaller, new problems with fabricating the devices appear. For example, as the device sizes decrease, an increasingly greater number of contacts to the device need to be made within an increasingly smaller contact area. The number of contacts within a given surface area of an integrated circuit is generally referred to as the contact density. Obviously, as the contact density of the integrated circuit increases, so too will the contact density of the associated packaging for the integrated circuit tend to increase.

This situation of increasing contact density tends to create difficulties in providing the number of contacts required in a manner where signal integrity through the contacts is maintained. Further, routing the signals through the contacts to the package presents additional challenges as the contact density increases.

What is needed, therefore, is a ball assignment for a ball grid array package and an associating routing structure for an associated printed circuit board that is capable of handling the high contact count within a relatively limited contact area and in a manner where signal integrity is maintained.

SUMMARY

The above and other needs are met by a printed circuit board having contacts in a contact array of rows and columns. Groups of n columns of the contacts are electrically connected to n−1 columns of vias disposed interstitially in a via array between the n columns of the contacts. A major vertical routing channel is formed between adjacent groups of n columns of the contacts and the n−1 columns of vias. First electrical traces are electrically connected to a first number of the vias. The first electrical traces are routed to an outside edge of the via array through the major vertical routing channel.

Thus, by grouping the contact connections to a smaller number of vias, and thereby creating the major vertical routing channel, a greater number of traces can be routed out of the via array through the open space provided by the major vertical routing channel. In this manner a greater number of traces can be routed out on each layer of the printed circuit board, and fewer layers of the printed circuit board are required for routing out the contacts.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
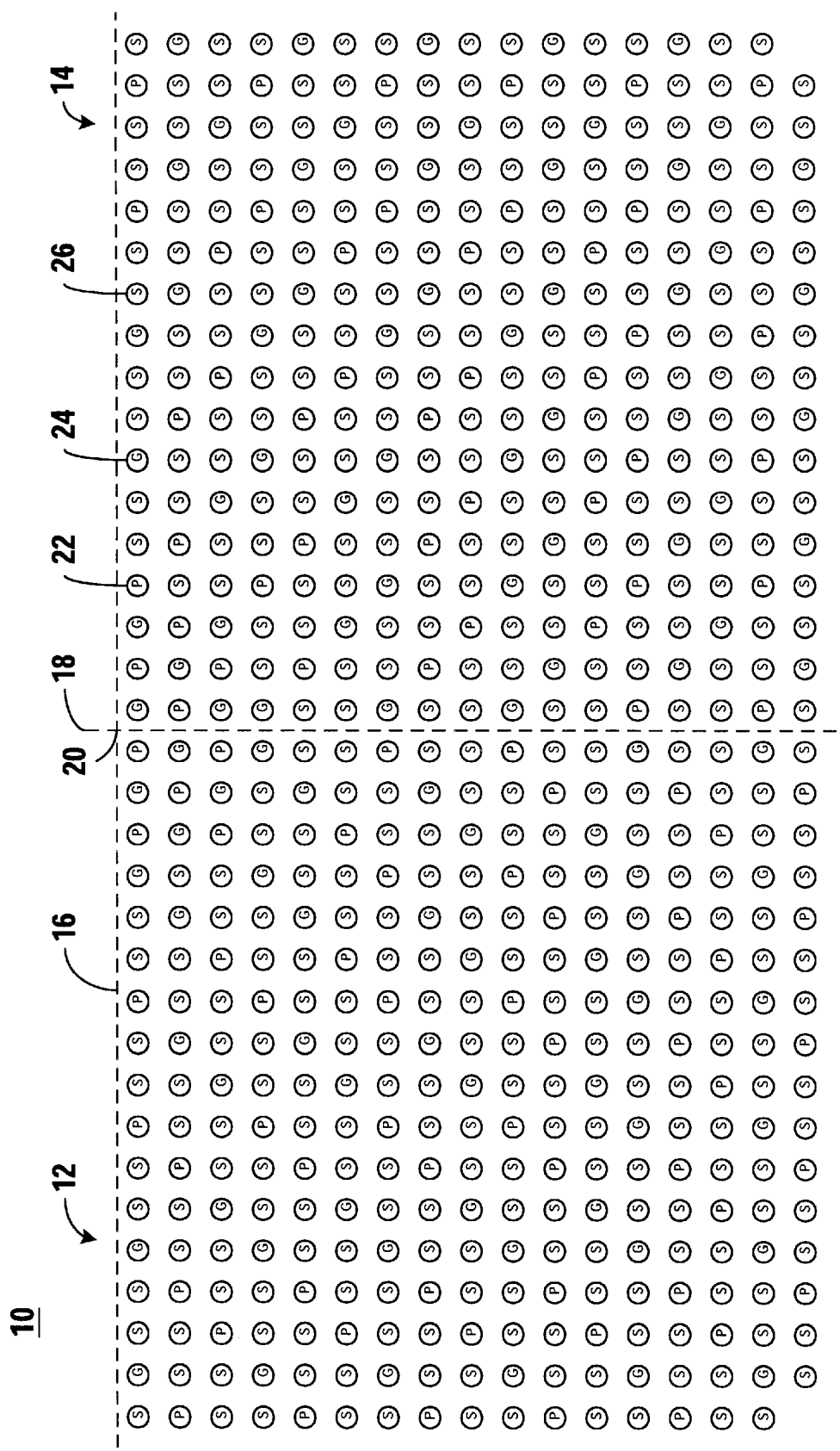
FIG. 1 is a top plan view of a ball grid array at the top surface of a printed circuit board.

Referring now to FIG. 1 there is depicted a top level of four levels of a printed circuit board 10 according to a preferred embodiment of the present invention. The top level of the printed circuit board 10 depicts the locations of contact for various purposes. For example, there are power contacts 22, ground contacts 24, and signal contacts 26. In general, the power contacts 22 provide power from a power source through the printed circuit board 10 to the integrated circuit. The ground contacts 24 provide a ground from a ground source through the printed circuit board 10 to the integrated circuit. Finally, the signal contacts 26 provide varying signals back and forth between the printed circuit board 10 and the integrated circuit.

As depicted in FIG. 1, the layout of the various contacts may be thought of as a top plan view. It is appreciated that a similar contact array layout is provided on a mating surface of the packaged integrated circuit. If viewed through the packaged integrated circuit from the opposing side of the packaged integrated circuit, the contact array layout is identical to that as depicted for the printed circuit board 10. However, if the contact array on the packaged integrated circuit is viewed directly from the surface of the packaged integrated circuit upon which it resides, then the layout of the contact array is a mirror image of that as depicted for the printed circuit board 10. As depicted in FIG. 1, the contact array is preferably laid out in an orthogonal array, with the contacts 22, 24, and 26 disposed at the corners of the orthogonal array.

The designation of the receptor for the packaged integrated circuit is referred to herein as the printed circuit board 10. It is appreciated that the invention is equally applicable to element pairs other than a packaged integrated circuit and a printed circuit board 10. For example, the packaged integrated circuit could be matched with a receptor other than a printed circuit board, or a package substrate could be matched with an integrated circuit. In reality, the limitation is only an artificial one of semantics and not a real limitation of concept.

The actual electrical connections between the packaged integrated circuit and the printed circuit board 10 is preferably made by an array of solder elements, called balls. These balls of solder are placed between the matching pairs of electrically conductive contact pads on each of the packaged integrated circuit and the printed circuit board 10. Electrical signals then flow from one set of contact pads through the solder balls to the other set of contact pads, typically in both directions.

As depicted in FIG. 1, the printed circuit board 10 is divided into quadrants by dividing lines 16 and 18. Two of the quadrants 12 and 14 are depicted and the two other quadrants that would exist on the other side of dividing line 16 are not depicted. It is appreciated that dividing lines 16 and 18 are depicted for ease in explanation and comprehension of the present invention, and are not representations of physical elements on the printed circuit board 10.

The two quadrants above the dividing line 16 that are not depicted are identical to the quadrants 12 and 14, as rotated into place around the intersection 20 of the dividing lines 16 and 18. Thus, the elements and description as provided below for quadrants 12 and 14 are sufficient to explain the elements of the quadrants that are not depicted above the dividing line 16. Further, it will be seen below that quadrant 12 has many similar features in its layout to those of quadrant 14. Quadrant 12 has similar signal locations to quadrant 14 when quadrant 12 is rotated about intersection 20 into the position of quadrant 14. However, the locations of the power contacts 22 and the ground contacts 24 are preferably transposed in quadrant 14 from their associated positions in quadrant 12, as becomes more apparent in later figures.

The array of power contacts 22, ground contacts 24, and signal contacts 26 is preferably laid out in a very specific arrangement, which is selected so as to improve signal quality through the signal contacts 26. In a most preferred embodiment, pairs of signal contacts 26 are set apart by one of either a single power contact 22 or a single ground contact 24. This arrangement of two signal contacts 26 followed by one of either a power contact 22 or a ground contact 24 is repeated in three axes on the array, being a horizontal axis, a vertical axis, and one of the two diagonal axes within each quadrant. The diagonal axis within a quadrant that radiates outward from the intersection of the dividing lines 16 and 18 does not follow this pattern in the preferred embodiment. However, the diagonal axis that is perpendicular to the aforementioned diagonal axis preferably does follow this pattern. Further, the pattern as described in the horizontal and vertical axes preferably extends across the dividing lines 16 and 18 and is continued in adjacent quadrants. It is also preferred that each signal contact 26 be within at least one diagonal distance of both a power contact 22 and a ground contact 24, as measured on the contact array. The signal contacts 26, as described above, are preferably within a single horizontal or vertical distance one from another. By arranging the contact array in this manner, signal quality through the signal contacts 26 is generally improved.

Figure 2:
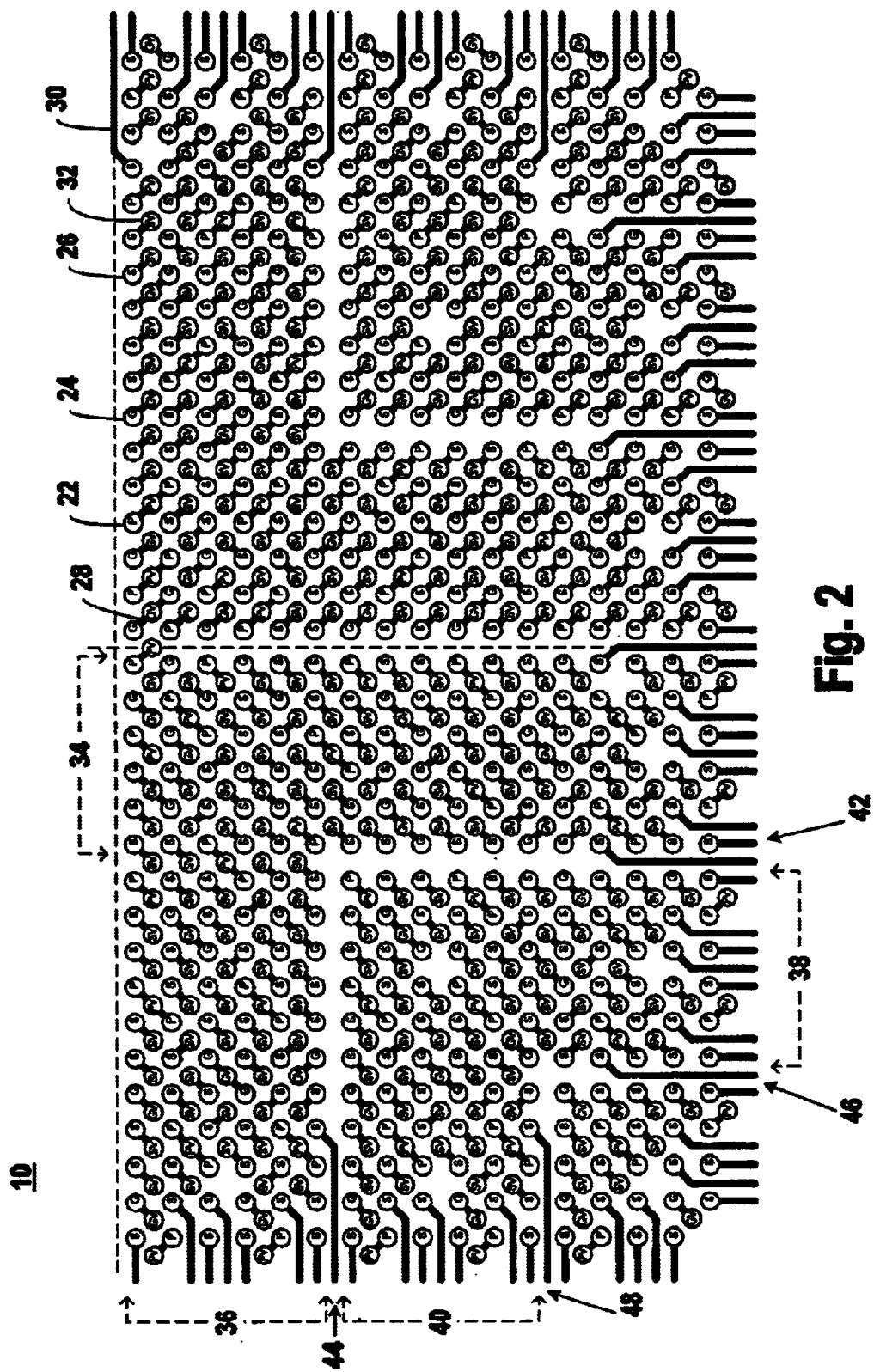
FIG. 2 is a top plan view of the ball grid array at the top surface of the printed circuit board, showing links to a conductive via array and electrical traces in the printed circuit board.

FIG. 2 provides a more complete visualization of the top layer of the printed circuit board 10. Additionally depicted in FIG. 2 are the electrically conductive vias 32, the electrically conductive links 28, and the electrically conductive traces 30. The links 28 electrically connect the contact pads 22, 24, and 26 to their associated vias 32. The vias 32 are preferably disposed in the diagonal interstitial spaces between the contact pads 22, 24, and 26. Further, the vias 32 preferably provide electrical continuity through all the layers of the printed circuit board 10, whereas the contact pads 22, 24, and 26 are preferably located only on the top surface of the printed circuit board 10. In this manner, the electrical signals provided to the contact pads 22, 24, and 26 are transmitted through all the layers of the printed circuit board 10.

The electrical traces 30 preferably function to route the signals from the contact pads 26 and the vias 32 to the peripheral edges of the printed circuit board 10, where they can be further electrically communicated to other elements of a larger circuit. Thus, all of the electrically conductive elements as described above, such as the contact pads 22, 24, and 26, the links 28, the traces 30, and the vias 32 are preferably all formed of an electrically conductive material such as a metal based material.

The links 28, the traces 30, and the vias 32 on the top layer of the printed circuit board 10 are all preferably covered with an electrically insulating material, and the contact pads 22, 24, and 26 are preferably not covered with the electrically insulating material, so that electrical contact to the top surface of the printed circuit board 10 can only be made from the integrated circuit via the contact pads 22, 24, and 26. In this manner, electrical contact is not inadvertently made to the other electrically conductive elements on the top surface of the printed circuit board 10. Thus, FIG. 2 depicts all of the relevant elements on the top surface of the printed circuit board 10, with the exception of the openings in the electrically insulating material, and FIG. 1 depicts just those elements of the top surface of the printed circuit board 10 to which electrical contact can be made to the integrated circuit.

In the preferred embodiment, several design goals are considered and balanced in laying out the contact pad array and the via array. Each of the signal contacts 26 is preferably electrically connected to a dedicated via 32 by a single electrical link 28, unless the specific signal contact 26 is to be routed out with a trace 30 on the top layer of the printed circuit board 10. Preferably, as many power contacts 22 as possible are also connected by an electrical link 28 to a dedicated via 32. However, this rule can be violated as necessary in order to stay within the other more predominant design constraints. However, preferably no more than two power contacts 22 are electrically connected to a single via 32, and most preferably the via 32 is disposed between the two power contacts 22, rather than having a power contact 22 disposed between a via 32 and another power contact 22 to which the via 32 is also electrically connected.

In a similar vein, preferably, as many ground contacts 24 as possible are also connected by a single electrical link 28 to a dedicated via 32. However, this rule can be violated as necessary in order to stay within the other more predominant design constraints. However, preferably no more than two ground contacts 24 are electrically connected to a single via 32, and most preferably the via 32 is disposed between the two ground contacts 24, rather having a ground contact 24 disposed between a via 32 and another ground contact 24 to which the via 32 is also electrically connected.

Additionally, it is preferred to lay out the arrays of contact pads and vias in an array that is as symmetrical as possible, so that the pattern so created may be more easily enlarged via duplication to handle arrays of increasing size, and also to make routing of the traces 30 easier because of its symmetry.

It is also desirable to route out the traces 30 using as few layers of the printed circuit board 10 as possible. In this manner, complexity in the fabrication of the printed circuit board 10 is reduced. For similar reasons, it is also desirable that the vias 32 extend through all layers of the printed circuit board 10, which also reduces complexity in the fabrication of the printed circuit board 10. In order to route out the traces 30 using as few layers as possible, it is preferable to route out as many traces 30 per layer of the printed circuit board 10 as possible, so long as other more predominant design goals are not violated.

As a part of bringing out as many traces 30 on a layer of the printed circuit board 10 as possible, the outermost signal contacts 26 are routed out without the use of an intervening via 32. Thus, traces 30 are connected directly to the outer most signal contacts 26, and routed out of the contact array on the top layer of the printed circuit board 10, as depicted in FIG. 2. As also depicted in FIG. 2, an additional number of signal contacts 26 are also selected to be routed out on the top layer of the printed circuit board 10. The additional signal contacts 26 are selected based upon space being available for their associated traces 30 on the top layer of the printed circuit board 10, and to provide additional space to route out other traces 30 as necessary on the lower layers of the printed circuit board 10.

When it is said herein that space is available for a trace 30, it is understood that a trace 30 on a given layer of the printed circuit board 10 preferably does not cross over any other electrically conductive element disposed upon the same layer of the printed circuit board 10 as the trace 30. For example, the trace 30 preferably does not cross over any other trace 30 on the same layer of the printed circuit board 10, or any of the contacts 22, 24, or 26, unless it is a contact with which it is associated, nor does it cross over any of the vias 32, unless it is a via 32 with which it is associated. Thus, a trace 30 preferably makes electrical contact with only a single element within the via array as depicted on a given layer of the printed circuit board 10.

As depicted in FIG. 2, in the preferred embodiment, six columns 34 of contact pads 22, 24, and 26 are connected to the five columns of vias 32 disposed between the six columns 34 of contact pads 22, 24, and 26. This pattern is repeated by connecting the six columns 38 of contact pads 22, 24, and 26 to the five columns of vias 32 disposed between the six columns 38 of contact pads 22, 24, and 26. In this manner, there is a first vertical channel 42 that is created between the six columns 34 of contact pads 22, 24, and 26 and the six columns 38 of contact pads 22, 24, and 26, and a second vertical channel 46 that is created between the six columns 38 of contact pads 22, 24, and 26 and the subsequent group of six or less columns of contact pads 22, 24, and 26, as the case may be, as determined by the outermost edge of the contact array. These channels are created by not placing vias 32 in these interstitial columns between the groups of six columns of the contact pads 22, 24, and 26.

In a most preferred embodiment, this pattern of electrically connecting six columns of contact pads 22, 24, and 26 into five columns of vias is repeated from the dividing lines 16 and 18 of the printed circuit board 10 outwards in both horizontal and vertical directions to the edge of the contact array, where the last group of columns may have fewer than six columns of contact pads 22, 24, and 26 within it, but preferably not more than six columns of contact pads 22, 24, and 26 within it. Thus, in the present example as depicted in the figures, there are a total of seventeen rows and seventeen columns of contact pads 22, 24, and 26 within each quadrant. The inner most three rows and columns of each quadrant are preferably comprised of power contacts 22 and ground contacts 24, leaving a total of fourteen rows and columns of signal contact pads 26. However, it is appreciated that this is by way of example only, and that in actual practice either a greater number or a lesser number of rows and columns of contact pads 22, 24, and 26 may be adapted to benefit from the invention as described herein.

Similar to that as described above, six rows 36 of contact pads 22, 24, and 26 are also electrically connected to the interstitial five rows of vias between them, and the six rows 40 of contact pads 22, 24, and 26 are further electrically connected to the five interstitial rows of vias between them, producing a first horizontal channel 44 and a second horizontal channel 48 in a manner similar to that as described above for the vertical channels 42 and 46. As can be seen in FIG. 2, the first vertical channel 42 preferably connects to the first horizontal channel 44, and the second vertical channel 48 preferably connects to the second horizontal channel 46. Thus, in the preferred embodiment, the horizontal channels are not created past the interior point at which they intersect the vertical channels, and the vertical channels are not created past the interior point at which they intersect the horizontal channels. However, it is appreciated that in alternate embodiments the vertical and horizontal channels do not necessarily either extend to a point at which they intersect or terminate at the point at which they intersect.

The four channels described above, namely the first vertical channel 42, the second vertical channel 46, the first horizontal channel 44, and the second horizontal channel 48, are major channels through which the traces 30 can be routed. However, it is appreciated that there are other routing channels as well. The spaces between electrically conductive elements such as contact pads 22, 24, and 26 and vias 32, where electrical traces 30 can be routed, are also considered to be routing channels. However, the grouping of contact pads 22, 24, and 26, both horizontally and vertically, to form the major channels as described above, is a tremendous benefit of the present invention.

Although other numbers of rows of contact pads 22, 24, and 26 and columns of contact pads 22, 24, and 26 can be used to form the groups that define the channels, six tends to be the preferred number of rows or columns of contact pads 22, 24, and 26 within a group. By forming groups of more than six rows or columns of contact pads 22, 24, and 26, reduced benefits tend to be developed, especially as the array size of the contact pads 22, 24, and 26 decreases. On the other hand, by forming groups of less than six rows or columns of contact pads 22, 24, and 26, there is a tendency to not be able to route out all of the traces 30 on a reduced number of layers of the printed circuit board 10. Thus, groups of six rows and columns of contact pads 22, 24, and 26 tends to be the preferred number.

The groups of rows and columns of contact pads are preferably connected to a number of vias 32 that is less by one than the number of rows or columns in the group of contact pads. In other words, n rows or columns of contact pads are preferably electrically connected to n–1 rows or columns of vias 32. This tends to require that some power contacts 22 are connected to a common via 32, and that some ground contacts 24 are connected to a common via 32. It also concentrates the vias 32 used for signal contacts 26 into specified portions of the via array. However, these conditions are greatly offset by the benefits as described below.

It is preferred that at each layer of the printed circuit board 10, each of the routing channels be filled with traces 30. In this manner, the maximum number of traces 30 are present on each of the layers of the printed circuit board 10, which in turn indicates that the fewest number of layers of printed circuit board 10 is required. However, it is appreciated that, depending upon the number of contact pads that need to be routed out, all of the routing channels on the last layer of the printed circuit board 10 may not be required. Thus, the overage of available routing channels may be used on other layers of the printed circuit board 10 as desired, to more easily route out the contacts. In other words, open or unused routing channels can be spread around between the different layers of the printed circuit board 10 as desired, so long as there is preferably no increase in the number of layers of the printed circuit board 10 that are required because of the routing channels that are left unused.

Figure 3:
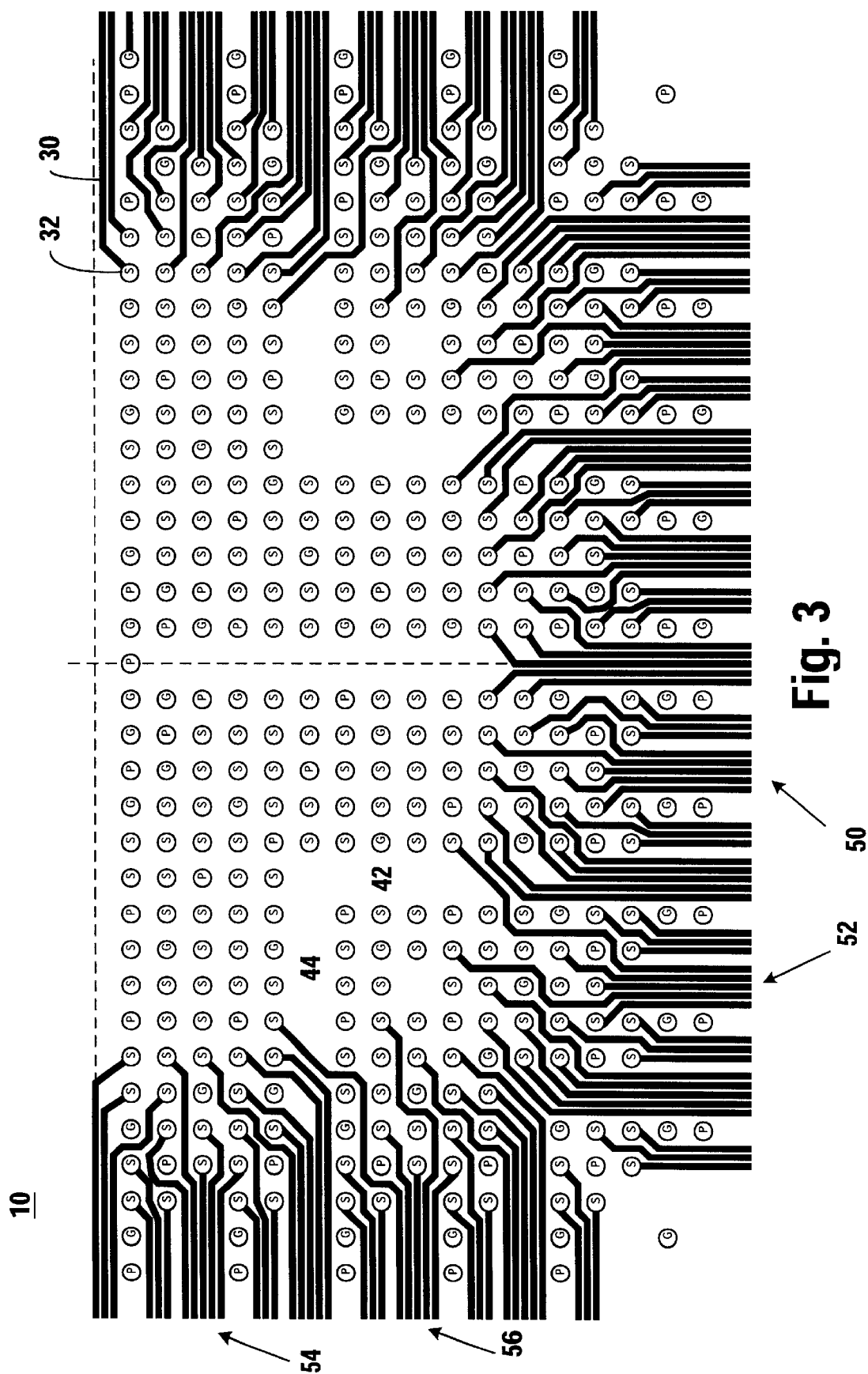
FIG. 3 is a top plan view of the via array and electrical traces on the second layer of the printed circuit board.

The biggest impact of the grouping of the contact pads 22, 24, and 26 and the formation of the routing channels 42, 44, 46, and 48 can be seen with reference to FIG. 3. As can be seen, five traces 30 fit within the routing channels 42, 44, 46, and 48 in the example depicted in FIGS. 2 and 3. It is appreciated that for other technologies, where the relative sizes of the contact pads 22, 24, and 26, the spacing between the contact pads 22, 24, and 26, and the traces 30 may be different, a different grouping of the contact pads 22, 24, and 26 other than in groups of six may be more optimal. However, for the relative sizes as are standard in the art, the grouping of six tends to be preferred, as described above.

In FIG. 3, only the vias 32 are present, and the contact pads contact pads 22, 24, and 26 are not present, as the contact pads 22, 24, and 26 do not extend through all the layers of the printed circuit board 10 in the manner that the vias 32 preferably do. Thus, with the sixth column or row of vias 32 missing from one side of the major channels, and the first column or row of vias 32 missing from the other side of the major channels, it is seen that the major channels that have been formed from the grouping of the vias 32 provide the ability to route about five adjacent traces 30. Thus, a greater number of vias 32 can be routed out through the major channels on each layer, which in turn tends to reduce the total number of layers of printed circuit board 10 that are required to route out all of the contact pads.

As depicted in the various figures, preferably only the signal contact pads 26 and the vias 32 that are connected to the signal contact pads 26 are routed out. Although the invention could be extended to routing out some or all of the power contact pads 22 and some or all of the ground contact pads 24, and the vias 32 that are associated with them, in the preferred embodiments these contact pads 22 and 24 are each routed out on a single plane where most or all of the vias 32 associated with the power contact pads 22 are connected to a single power plane on a unique layer of the printed circuit board, and most or all of the vias 32 associated with the ground contact pads 24 are connected to a single ground plan on a unique layer of the printed circuit board. Thus, in the preferred embodiment, only the various signal contacts 26 and the vias 32 associated with them require separate and distinct traces 30 to route out each one.

FIG. 3 also depicts another benefit of the preferred embodiment of the present invention as described. By preferentially pushing the power and ground vias 32 into as few columns and rows as possible at the periphery of the via array, minor channels 50, 52, 54, and 56 are created. These channels 50, 52, 54, and 56 are referred to as minor channels because they do not extend as far into the via array as do the major channels 42, 44, 46, and 48, nor do the minor channels 50, 52, 54, and 56 intersect with one another as do major channels 42, 44, 46, and 48. However, as can be seen in FIG. 3, the creation of the minor channels 50, 52, 54, and 56 allows for a very large number of traces 30 to be accommodated near the peripheral edges of the via array, which in turn allows a very large number of vias 32 to be routed out on the second layer of the printed circuit board 10. The benefit of these minor channels 50, 52, 54, and 56 tends to not be realized on the subsequent layers of the printed circuit board 10, because of the vias 32 in the more internal portions of the via array that cannot be moved into a single column or row because of space constraints, and which therefore prevent the minor channels from extending further into the via array.

As can be seen from FIGS. 2 and 3, and as briefly mentioned above, a signal via 32 that is buried deeper within the via array is sometimes preferentially routed out of the via array on a higher layer of the printed circuit board 10 than is a signal via 32 that disposed more toward the peripheral edge of the via array. Although this is contrary to traditional thinking, there is disclosed herein a preferred design rule by which this preferential routing is accomplished. Preferably, if routing to a specific signal via 32 causes more than one routing channel to be blocked, then an alternate signal via 32 is selected for routing, which alternate signal via 32 does not require blocking of an additional channel. Thus, the preferred goal is to use every channel for active routing and for the routing of each via 32 to take no more than a single channel.

Figure 4:
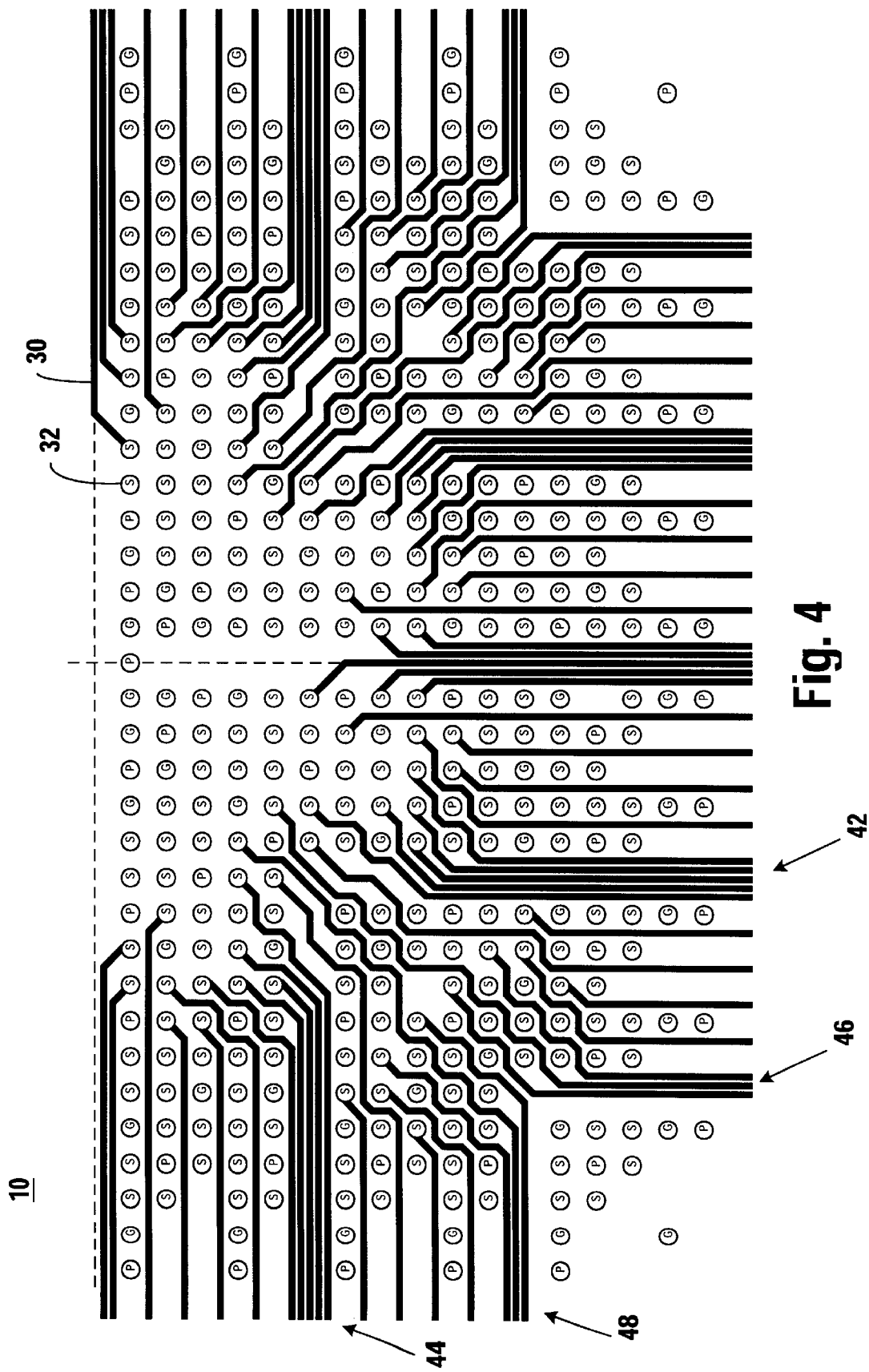
FIG. 4 is a top plan view of the via array and electrical traces on the third layer of the printed circuit board.

Referring now to FIG. 4, there is depicted the third layer of the printed circuit board 10 according to the present invention. As can be seen, the major routing channels 42 and 44 are preferably used to capacity to route out the traces 30 for five signal vias 32. However, the other two major routing channels 46 and 48 are not used to capacity to route out the traces 30, because a large portion of the signal vias 32 in these more outlying portions of the via array have already been routed out. It can also be seen that the minor routing channels described above cannot receive an increased number of traces 30, because the number of traces 30 in the minor routing channels on the layer depicted is limited by the number of traces 30 that can fit in the interstitial routing channels that are located between adjacent columns and rows of vias 32, and which feed traces 30 into the minor routing channels. In other words, the minor routing channels are blocked by vias 32 within the via array. However, at this point in the routing scheme, there is still an acceptable number of vias 32 that can be routed out. Especially because of the capacity of the major channels 42 and 44 to handle a large number of traces 30.

It is appreciated that for via arrays of a larger size, the major routing channels 46 and 48 would be available to route out the greater number of vias 32 that would be present in the larger array. Further, depending upon how large the via array was, there may also be additional major routing channels formed as additional groups of six rows or columns of contact pads are grouped into vias on the top layer of the printed circuit board 10. Thus, the present invention provides for an increase in the scale of the integrated circuit to which it is applied.

Figure 5:
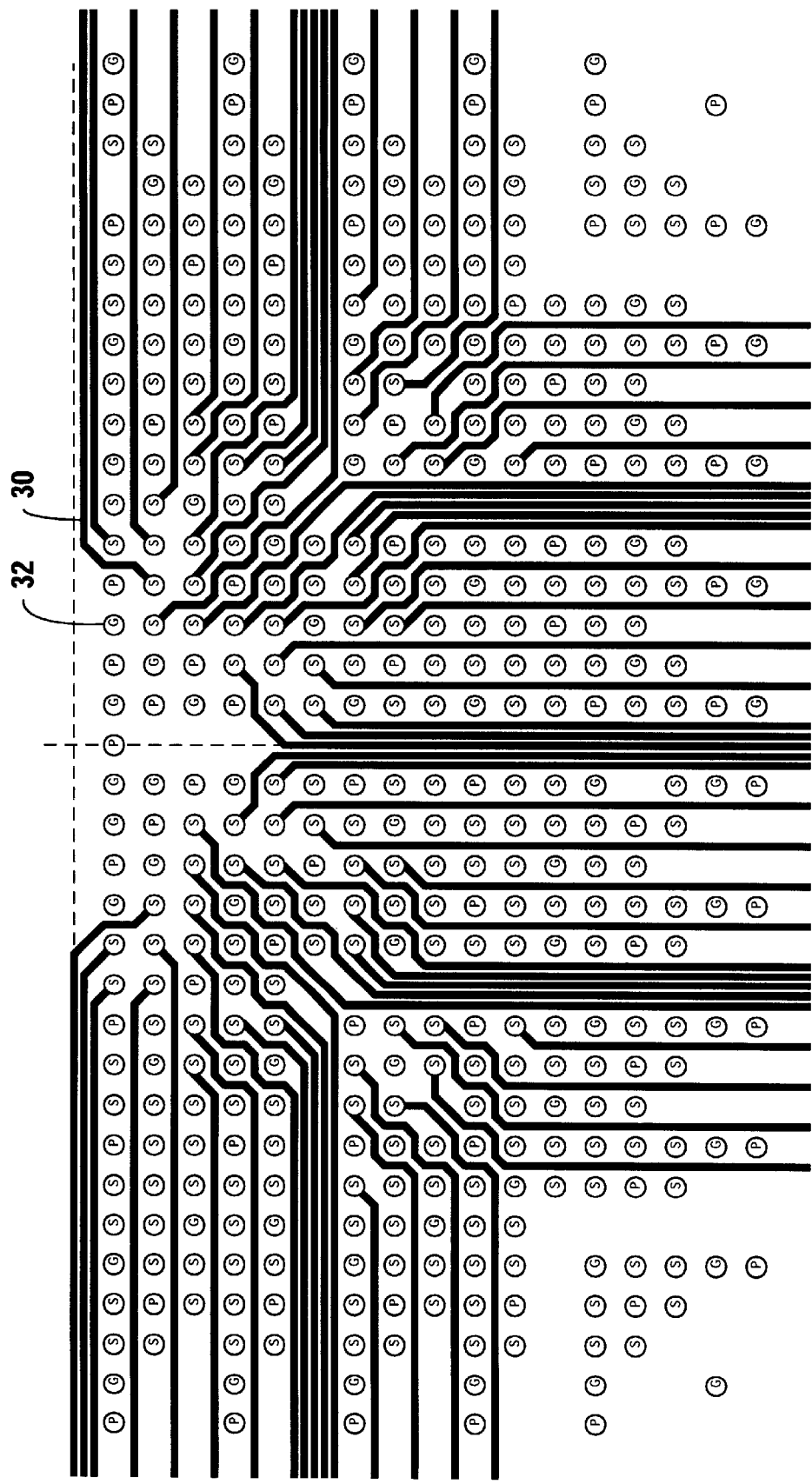
FIG. 5 is a top plan view of the via array and electrical traces on the fourth layer of the printed circuit board.

FIG. 5 then depicts the routing of the final signal vias 32. As can be seen, the routing channels that are more toward the corners of the via array are no longer needed in the present example. However, the major routing channels 42 and 44 (labeled on FIG. 4) are still used to capacity to route out the innermost signal vias 32. Thus, the preferential grouping of rows and columns of contact pads, as described above, provides tremendous benefits throughout the different routing layers of the printed circuit board 10, and tends to greatly reduce the number of such routing layers that are required to route out all of the different signals from the integrated circuit.

Figure 6:
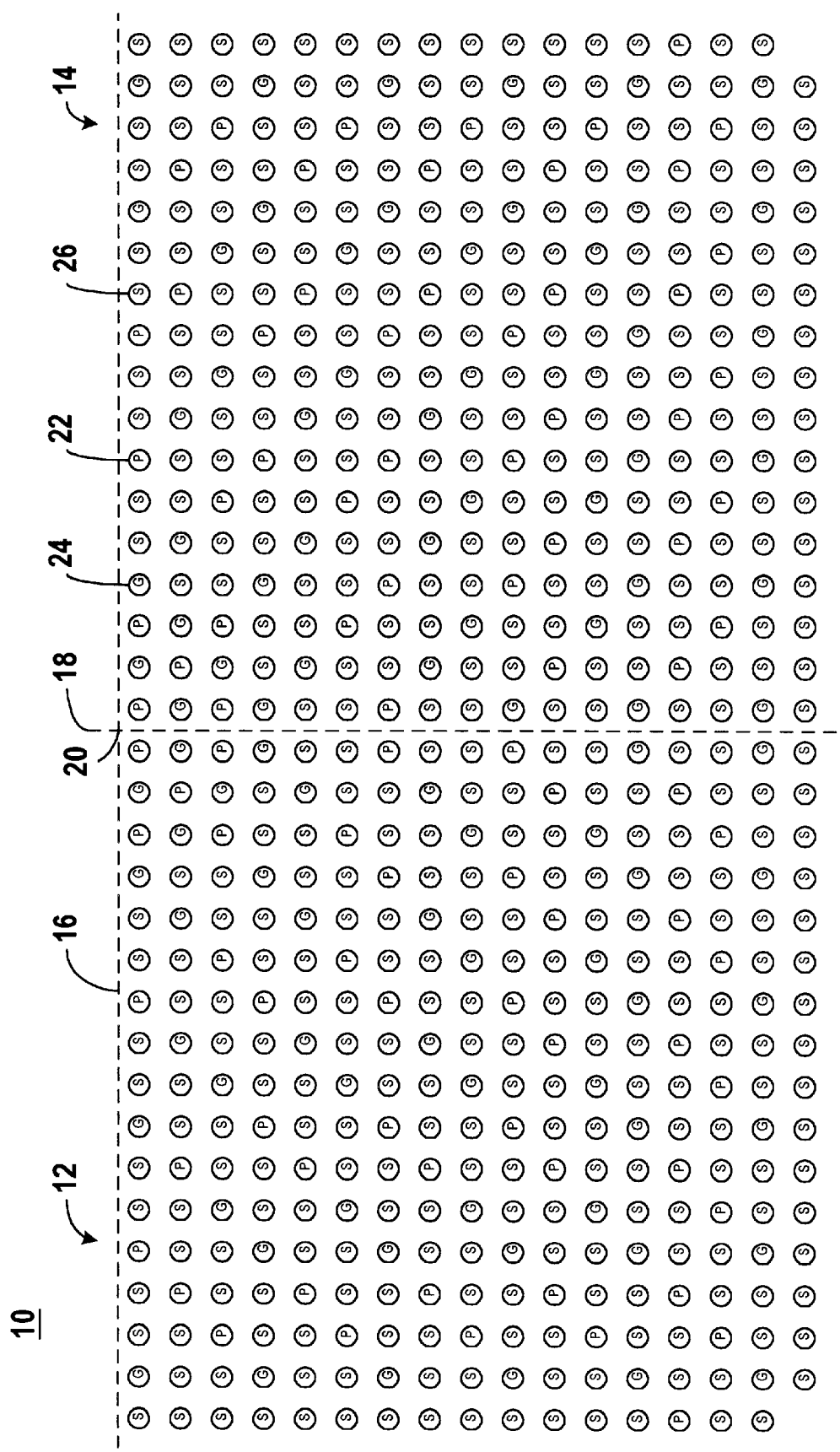
FIG. 6 is a top plan view of a ball grid array at the top surface of a printed circuit board according to an alternate embodiment.

FIGS. 6–10 depict an alternate embodiment of the contact array, via array, and traces 30, where the contact array of FIG. 6 is similar to that depicted in FIG. 1. However, the positions of some of the power contacts 22 and some of the ground contacts 24 have been changed from the embodiment depicted in FIG. 1. In other words, some of the positions of the contact array depicted in FIG. 1 that are occupied by power contacts 22 are occupied by ground contacts 24 in the contact array depicted in FIG. 6, and some of the positions of the contact array depicted in FIG. 1 that are occupied by ground contacts 24 are occupied by power contacts 22 in the contact array depicted in FIG. 6. However, the preferred considerations in regard to arrangement of the array as described above, such as pairing of the signal contacts in the various axes, is maintained in this alternate embodiment.

There is another difference in the embodiment of FIG. 6, in that all of the contacts at a perimeter of the contact array are signal contacts 26, and none of the contacts at the perimeter of the contact array are power contacts 22 or ground contacts 24. Thus, some of the signal contacts 26 at the perimeter of the contact array are in triplets in an axis with other signal contacts 26, but none of the signal contacts 26 are in a singlet at the perimeter of the contact array. Further, all of the signal contacts 26 at the perimeter of the contact array are within at least one diagonal distance of a ground contact 24, but are not within one diagonal distance of a power contact 22. In this embodiment, the contact array provides for a greater number of signal contacts 26, and thus has a high signal density output. However, this comes at somewhat of a compromise of signal quality through those signals transferred through the signal contact 26 at the perimeter of the contact array. In some applications, though, the increase in signal density is a more important factor than the increase in signal quality at the perimeter of the contact array. In other applications, signals that are more resistant to degradation can be routed to the signal contacts 26 at the perimeter of the contact array, and thus any decrease in signal quality tends to have less of an effect.

Figure 7:
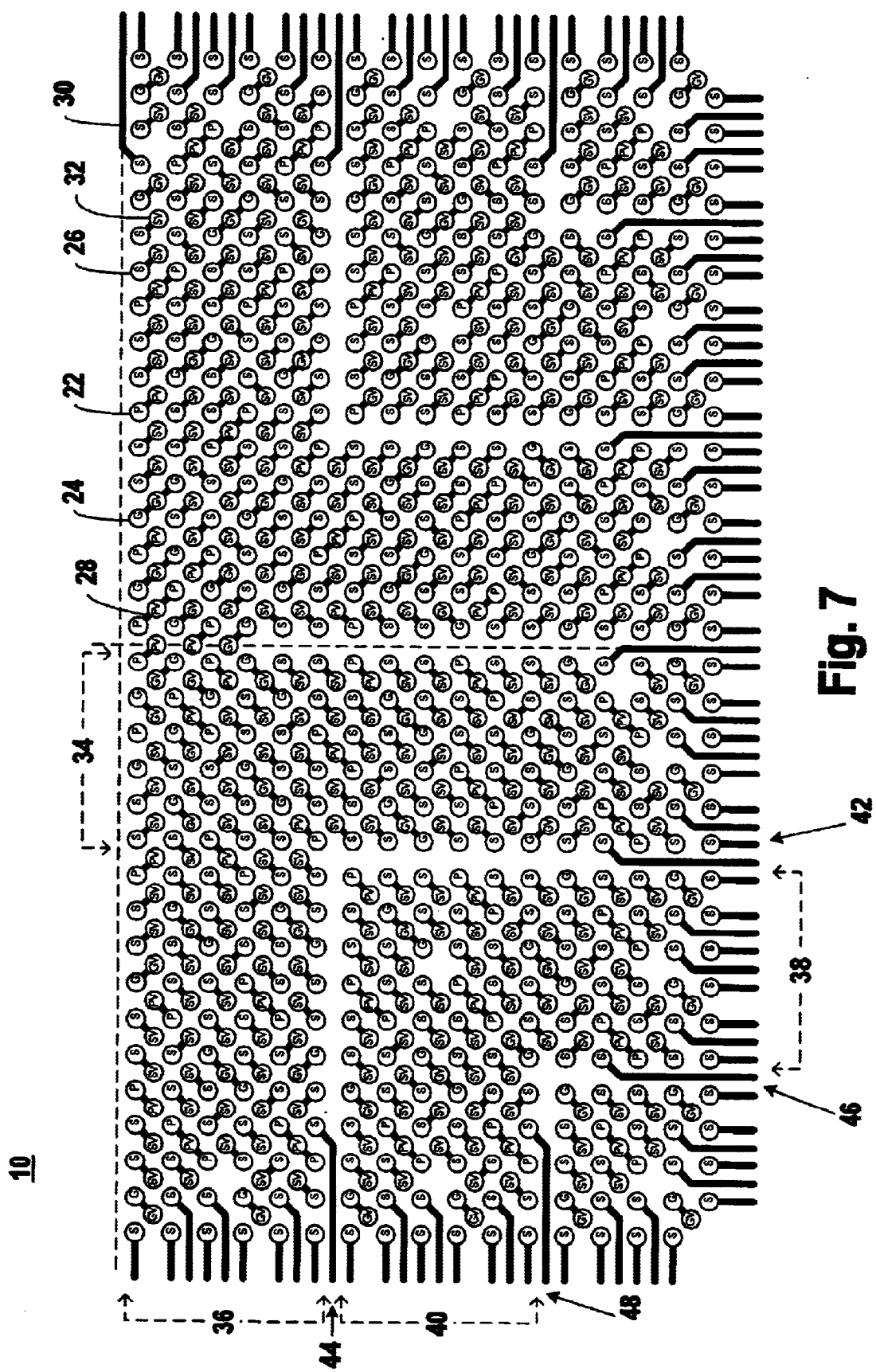
FIG. 7 is a top plan view of the ball grid array at the top surface of the printed circuit board, showing links to a conductive via array and electrical traces in the printed circuit board according to the alternate embodiment.
Figure 8:
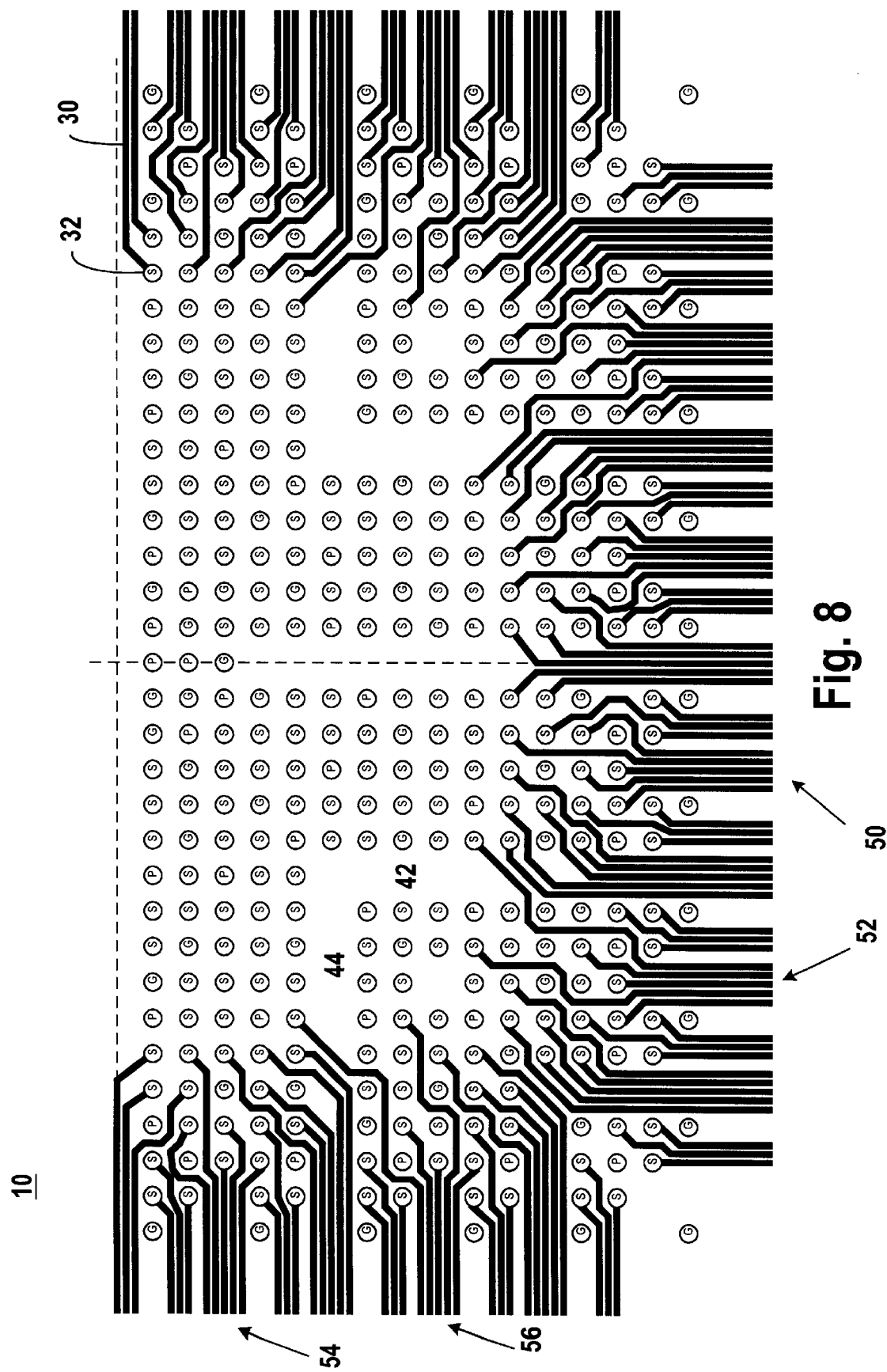
FIG. 8 is a top plan view of the via array and electrical traces on the second layer of the printed circuit board according to the alternate embodiment.
Figure 9:
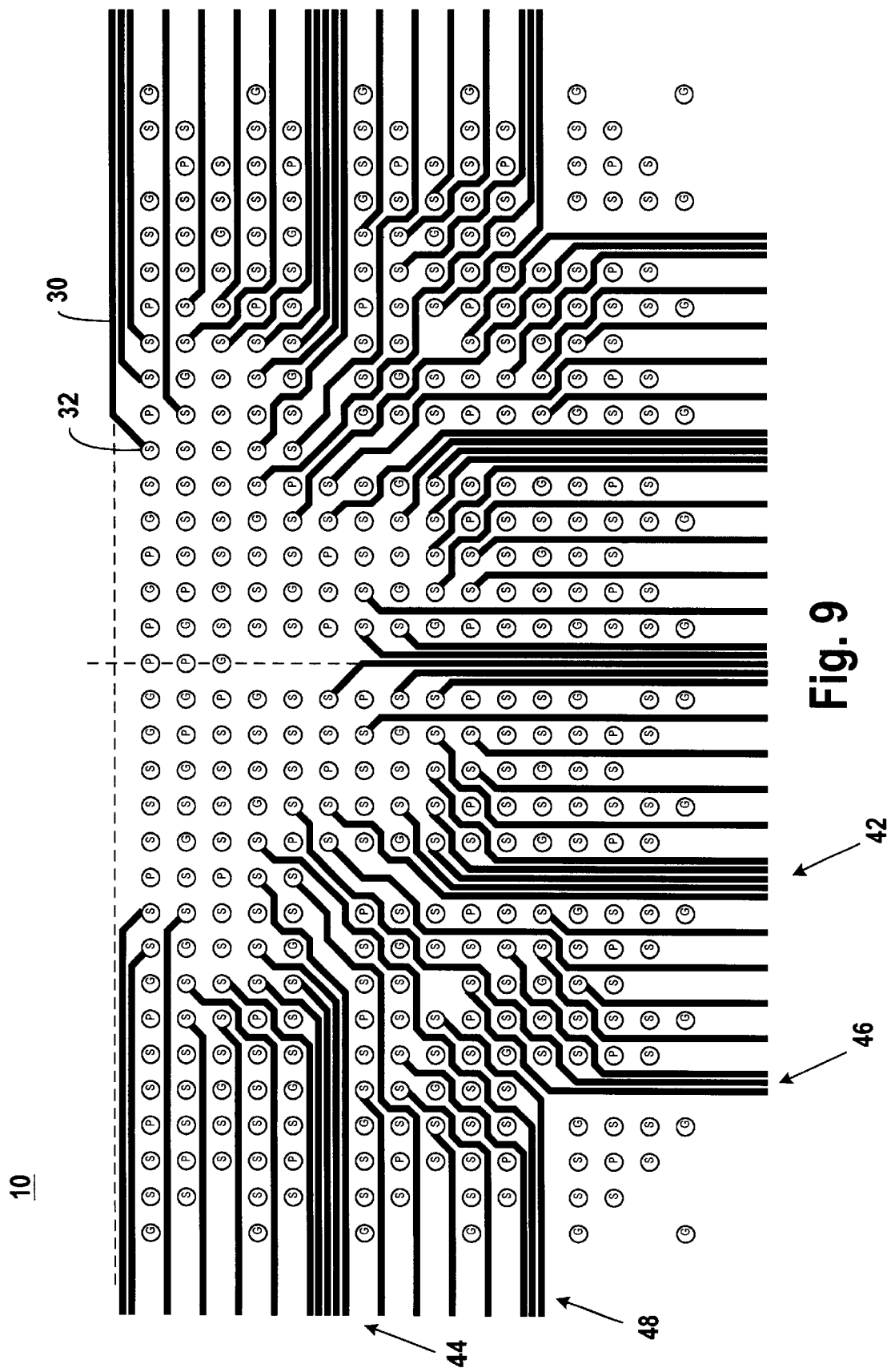
FIG. 9 is a top plan view of the via array and electrical traces on the third layer of the printed circuit board according to the alternate embodiment.
Figure 10:
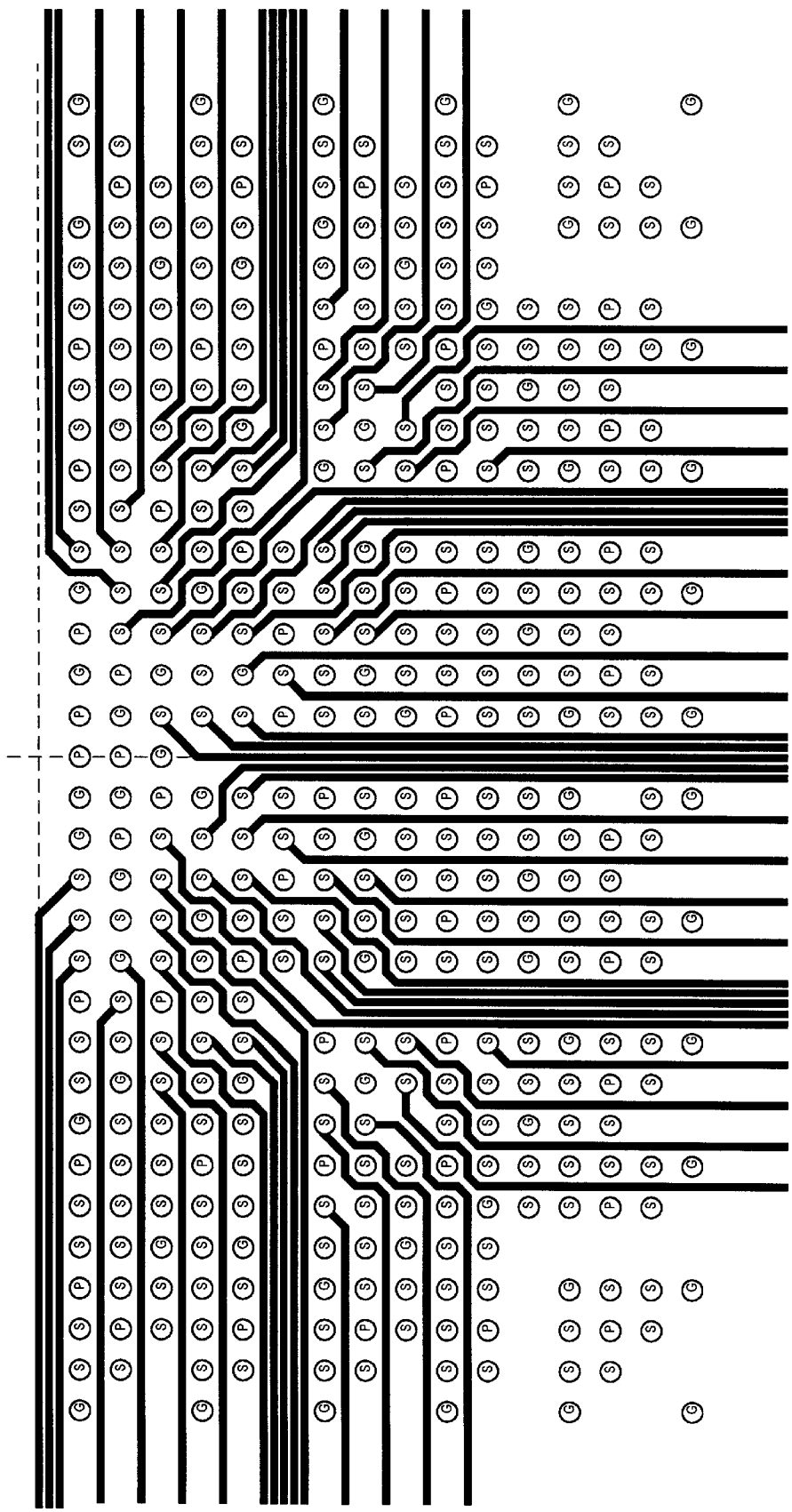
FIG. 10 is a top plan view of the via array and electrical traces on the fourth layer of the printed circuit board according to the alternate embodiment.

As depicted in FIG. 7, all of the signal contacts 26 at the perimeter of the contact array can be routed out on the top level of the printed circuit board. Thus, in the embodiment depicted in FIGS. 6–10, no additional levels are needed in the printed circuit board to route out the additional signal contacts 26. FIG. 7 also depicts the major and minor routing channels as describes above, and incorporates the other preferred aspects and benefits of the invention as described above. FIGS. 8–10 depict the other levels of the printed circuit board, similar to that as described above.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A printed circuit board, comprising:

contacts in a contact array of rows and columns on the printed circuit board, groups of n columns, where n is a positive integer, at least equal to two, of the contacts electrically connected to n−1 columns of vias disposed interstitially in a via array between the n columns of the contacts, a major vertical routing channel formed between adjacent groups of n columns of the contacts and the n−1 columns of vias, where the major vertical routing channel does not extend completely through the contact array, first electrical traces electrically connected to a first number of the vias, the first electrical traces routed to an outside edge of the via array through the major vertical routing channel, groups of n rows of the contacts electrically connected to n−1 rows of vias disposed interstitially in the via array between the n rows of the contacts, a major horizontal routing channel formed between adjacent groups of n rows of the contacts and the n−1 rows of vias, where the major horizontal routing channel does not extend completely through the contact array, the major vertical routing channel intersecting with the major horizontal routing channel, second electrical traces electrically connected to a second number of the vias, and the second electrical traces routed to the outside edge of the via array through the major horizontal routing channel.

2. The printed circuit board of claim 1, further comprising a plurality of major vertical routing channels.

3. The printed circuit board of claim 1, further comprising:

a minor horizontal routing channel adjacent a portion of the vias in the via array that are connected to contacts in a row near the outside edge of the via array, and third electrical traces routed to the outside edge of the via array through the minor horizontal routing channel.

4. The printed circuit board of claim 1, further comprising:

a minor vertical routing channel adjacent a portion of the vias in the via array that are connected to contacts in a column near the outside edge of the via array, and fourth electrical traces routed to the outside edge of the via array through the minor vertical routing channel.

5. The printed circuit board of claim 1, wherein a portion of the contacts are signal contacts, and each of the signal contacts is adjacent another of the signal contacts in groups of two within the contact array.

6. The printed circuit board of claim 1, wherein a first portion of the contacts are signal contacts, a second portion of the contacts are power contacts, and a third portion of the contacts are ground contacts, and each of the signal contacts is adjacent to at least one of the power contacts and at least one of the ground contacts within the contact array.

7. The printed circuit board of claim 1, wherein n equals six.

8. The printed circuit board of claim 1, wherein the vias in the via array are disposed interstitially and diagonally between the contacts.

9. The printed circuit board of claim 1, wherein the contacts at a perimeter of the contact array are signal contacts.

10. An integrated circuit package substrate, comprising:

contacts in a contact array of rows and columns on the integrated circuit package substrate, groups of n columns of the contacts, where n is a positive integer, at least equal to two, electrically connected to n-1 columns of vias disposed interstitially in a via array between the n columns of the contacts, a major vertical routing channel formed between adjacent groups of n columns of the contacts and the n-1 columns of vias, where the major vertical routing channel does not extend completely through the contact array, first electrical traces electrically connected to a first number of the vias, and the first electrical traces routed to an outside edge of the via array through the major vertical routing channel, groups of n rows of the contacts electrically connected to n-1 rows of vias disposed interstitially in the via array between the n rows of the contacts, a major horizontal routing channel formed between adjacent groups of n rows of the contacts and the n-1 rows of vias, where the major horizontal routing channel does not extend completely through the contact array, the major vertical routing channel intersecting with the major horizontal routing channel, second electrical traces electrically connected to a second number of the vias, and the second electrical traces routed to the outside edge of the via array through the major horizontal routing channel.

11. The integrated circuit package substrate of claim 10, further comprising a plurality of major vertical routing channels.

12. The integrated circuit package substrate of claim 10, further comprising:

a minor horizontal routing channel adjacent a portion of the vias in the via array that are connected to contacts in a row near the outside edge of the via array, and third electrical traces routed to the outside edge of the via array through the minor horizontal routing channel.

13. The integrated circuit package substrate of claim 10, further comprising:

a minor vertical routing channel adjacent a portion of the vias in the via array that are connected to contacts in a column near the outside edge of the via array, and fourth electrical traces routed to the outside edge of the via array through the minor vertical routing channel.

14. The integrated circuit package substrate of claim 10, wherein a portion of the contacts are signal contacts, and each of the signal contacts is adjacent another of the signal contacts in groups of two within the contact array.

15. The integrated circuit package substrate of claim 10, wherein a first portion of the contacts are signal contacts, a second portion of the contacts are power contacts, and a third portion of the contacts are ground contacts, and each of the signal contacts is adjacent to at least one of the power contacts and at least one of the ground contacts within the contact array.

16. The integrated circuit package substrate of claim 10, wherein n equals six.

17. The integrated circuit package substrate of claim 10, wherein the vias in the via array are disposed interstitially and diagonally between the contacts.

18. The integrated circuit package substrate of claim 10, wherein the contacts at a perimeter of the contact array are signal contacts.

* * * * *